United States Patent
Yang et al.

[19]

[11] Patent Number: 6,136,645
[45] Date of Patent: *Oct. 24, 2000

[54] FABRICATION METHOD FOR SEMICONDUCTOR MEMORY DEVICE

[75] Inventors: Woun-Suk Yang; Chang-Jae Lee, both of Cheongju, Rep. of Korea

[73] Assignee: LG Semicon Co., Ltd., Cheongju, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/979,112

[22] Filed: Nov. 26, 1997

[30] Foreign Application Priority Data

Nov. 27, 1996 [KR] Rep. of Korea ....................... 96-58080

[51] Int. Cl.[7] .................................................. H01L 21/8242
[52] U.S. Cl. ............................ 438/254; 438/256; 438/397
[58] Field of Search .................................... 438/253, 254, 438/255, 256

[56] References Cited

U.S. PATENT DOCUMENTS

| | | |
|---|---|---|
| 5,014,103 | 5/1991 | Ema . |
| 5,140,389 | 8/1992 | Kimura et al. . |
| 5,459,096 | 10/1995 | Venkatesan et al. ....................... 437/67 |
| 5,512,163 | 4/1996 | Warfield .................................. 205/109 |
| 5,733,809 | 3/1998 | Dennison et al. ....................... 437/253 |

OTHER PUBLICATIONS

S. Wolf, Silicon Processing for the VLSI Era, vol. 2, Lattice Press, pp. 201–203, 1990.
Shibahara, et al., "1GDRAM Cell with Diagonal Bit–Line (DBL) Configuration and Edge Operation MOS (EOS) FET" IEEE (1994) p.p. 26.5.1–26.5.4.

*Primary Examiner*—Donald L. Monin, Jr.
*Assistant Examiner*—Ginette Peralta

[57] ABSTRACT

A fabrication method for a semiconductor memory device, which forms a capacitor over a bit line, includes the steps of forming an active region pattern on a semiconductor substrate, forming a field oxide region for electrically isolating single devices in the semiconductor substrate, forming a gate insulating film on the semiconductor substrate, forming a first conductive film to serve as a gate electrode on the gate insulating film, forming a first insulating film having a first etching characteristic on the first conductive film, and patterning the first insulating film and the first conductive film to form a plurality of word line patterns. Next a second insulating film, having the first etching characteristic, is formed over the semiconductor substrate, and is etched to form sidewall spacers at lateral walls of each word line pattern. A third insulating film is then formed over the semiconductor substrate, and removed from regions where a bit line is to be formed. This exposes the active region and forms a bit line trench pattern. A bit line is then formed with portions thereof disposed in the bit line trench pattern, and a capacitor is formed over the bit line. The different etching characteristics of the insulating films allows for a larger contact hole to be formed thereby improving the contact hole aspect ratio.

16 Claims, 11 Drawing Sheets

FABRICATION METHOD FOR SEMICONDUCTOR MEMORY DEVICE

BACKGROUND OF THE INVENTION

1. Field of the Invention

The present invention relates to a fabrication method of a semiconductor memory device, and more particularly, to an improved fabrication method for a memory cell of a semiconductor DRAM device which has a capacitor over bit line ("COB") structure.

2. Description of the Prior Art

Generally, because of increasingly high integration for a semiconductor memory device, many kinds of memory cell arrays and structures to be compatible with high integration have been suggested.

Figure 1A:
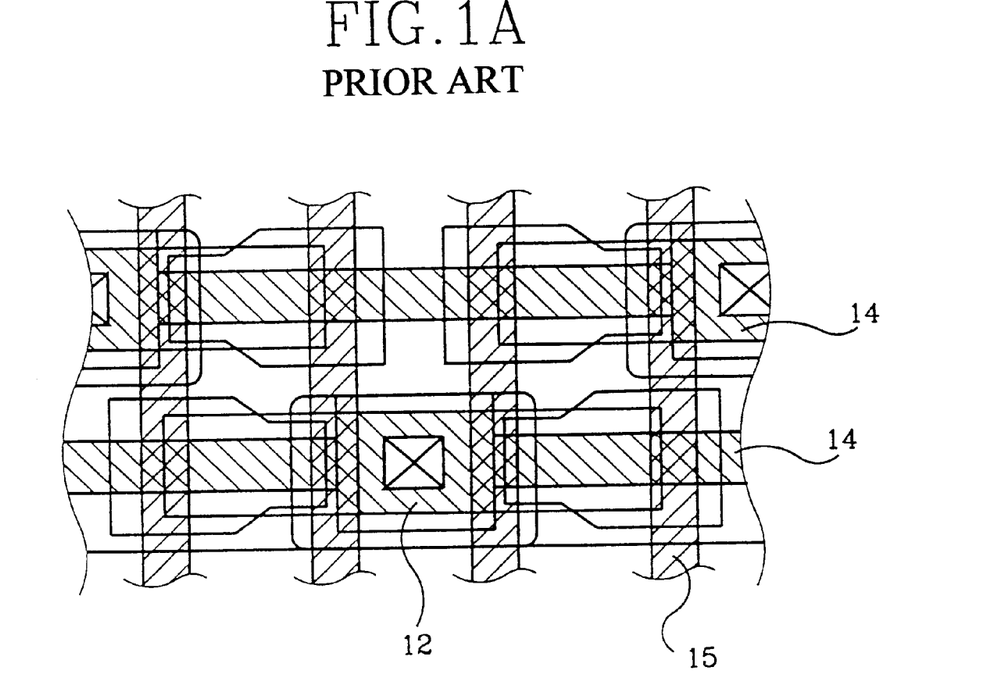
FIGS. 1A and 1B are respectively a plan view and a longitudinal cross-sectional view showing a lay out of a memory cell of semiconductor memory device having the CUB structure according to the conventional art.
Figure 1B:
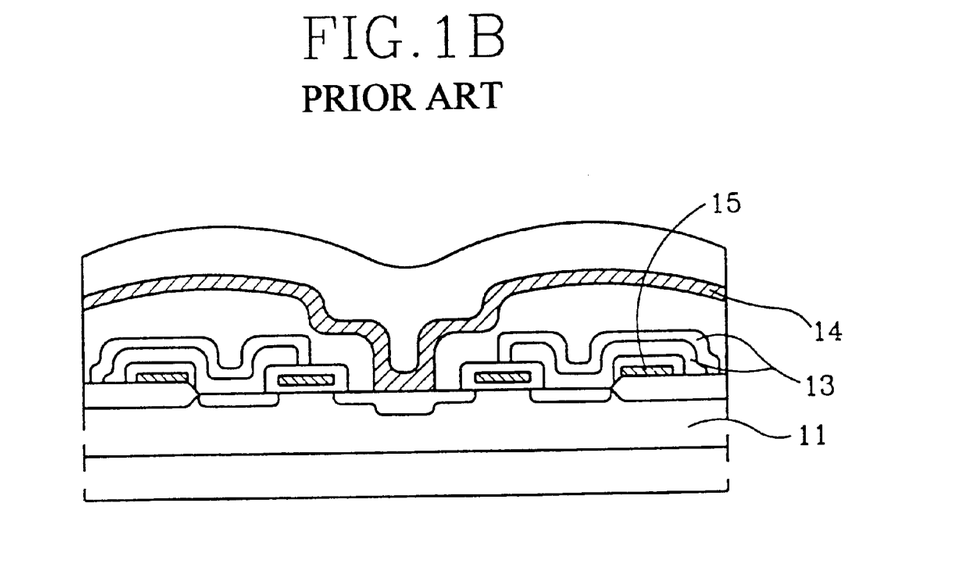

As shown in FIGS. 1A and 1B, a conventional art memory cell array is represented as having a capacitor under bit line (CUB) structure in which a capacitor 13 is formed on a rectangular active array 12 that is formed on a semiconductor substrate 11 and then a bit line 14 is formed thereon. Reference numeral 15 represents a gate line.

However, the memory cell having the above CUB structure has a limited capacitor area because the capacitor is located under the bit line. Therefore, the capacitor height must be increased so as to secure a capacitance level corresponding to that of the high integrated semiconductor memory device of the conventional art where the area for the capacitor has sharply decreased. Having a decreased capacitor area increases a bit line contact hole aspect ratio. Consequently, there are technical difficulties when filling a contact hole and forming a line pattern for a bit line. Accordingly, a semiconductor memory device for a 16M DRAM type, 64M DRAM type, or higher DRAM type requires a new cell array type structure.

Figure 2A:
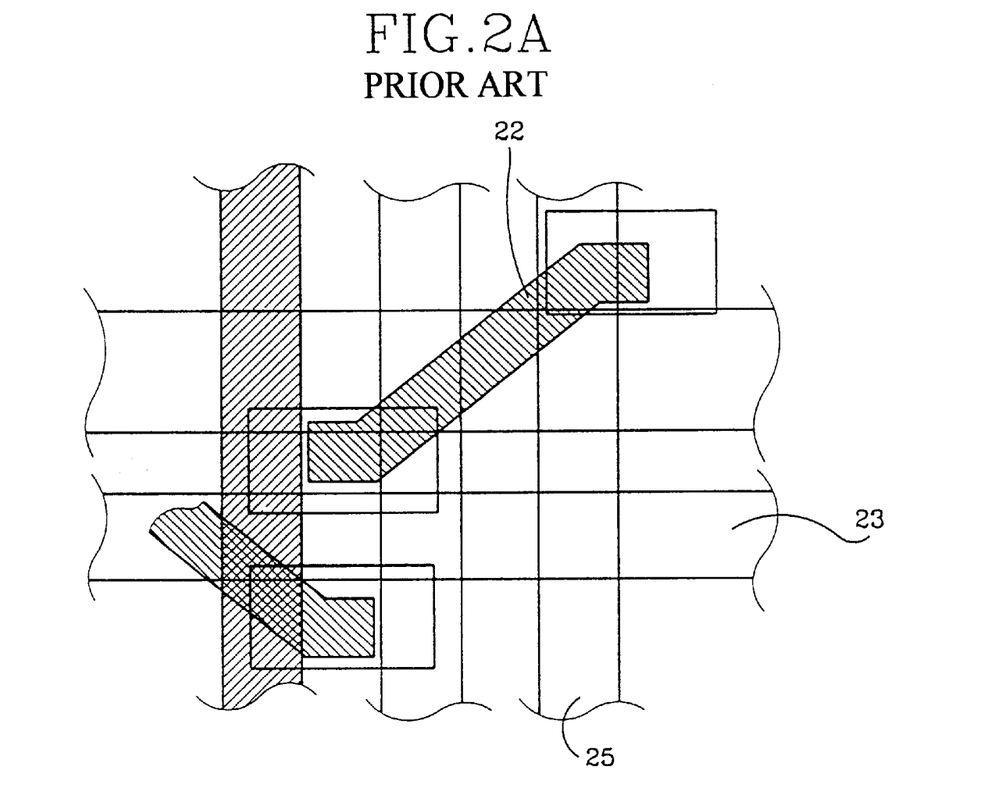
FIGS. 2A and 2B are respectively a plan view and a longitudinal cross-sectional view showing a lay out a memory cell of a semiconductor memory device having the COB structure according to the conventional art.
Figure 2B:
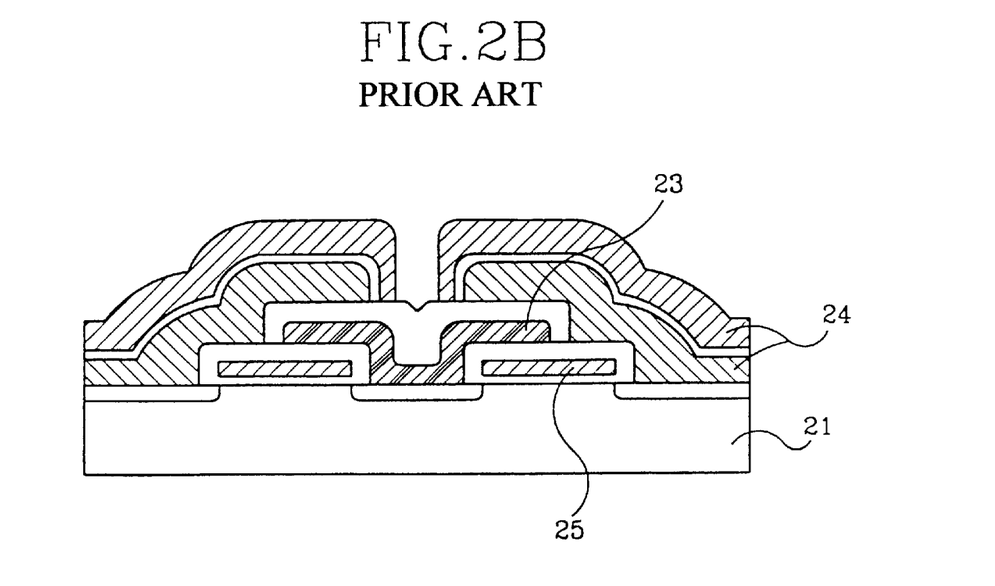

FIGS. 2A and 2B show a semiconductor memory device having a COB structure disclosed in U.S. Pat. No. 5,140,389 which is hereby incorporated by reference. As shown in these drawings, the COB structure shows a bit line 23 formed before a capacitor 24 so as to secure a region on the bit line 23 as a region for the capacitor 24. Thus, a capacitance level is increased, and a bit line contact hole aspect ratio is decreased. As a result, filling a contact hole and forming the bit line 23 is simplified.

Figure 3:
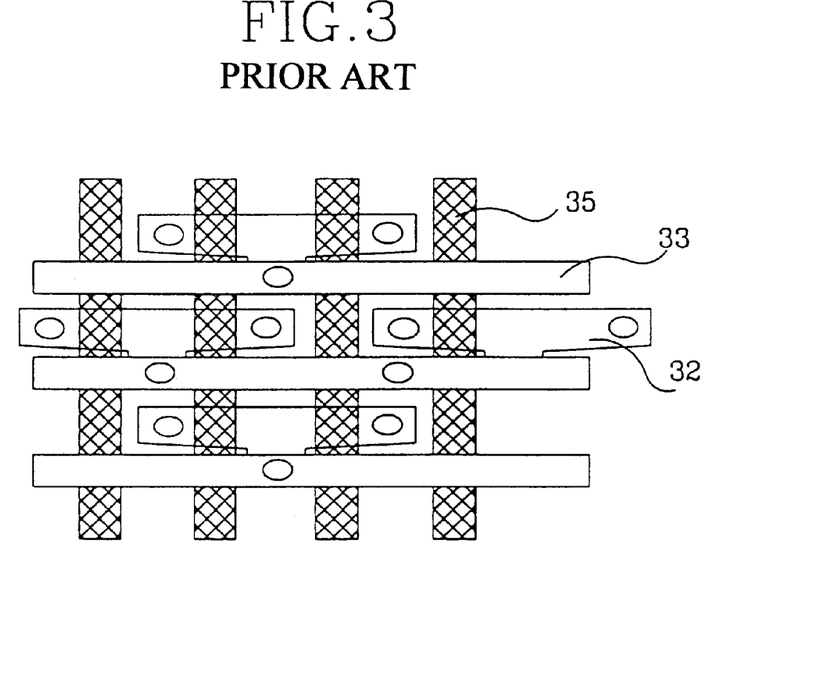
FIG. 3 is a plan view showing a lay out of a memory cell of a semiconductor memory device having a T-shaped active region according to the conventional art.

In the above COB structure, the capacitor 24 is formed on the bit line 23, and an active region 22 is designed to have a diagonal shape so that the active region 22 crosses with the bit line 23 and a word line 25. Since the active region 22 is diagonal in shape, there are more corners than the conventional active region 12 of FIG. 1A which causes serious shrinkage and distortion when performing a process involving photolithography. As a result, forming the active region pattern becomes difficult. Moreover, the diagonal active region 22 has a lower packing density in a predetermined area than the rectangular active region 12 of FIG. 1A; thereby causing a disadvantage in high integration. Accordingly, ultra high integrated 256M DRAM type devices as above require a new cell array type structure. A representative example, as shown in FIG. 3, shows a cell array structure using a T-shaped active region 32 that increases packing density to solve the low packing density of the diagonally shaped active regions. In FIG. 3, reference numerals 33 and 35 represent a bit line and a gate line, respectively.

Figure 4:
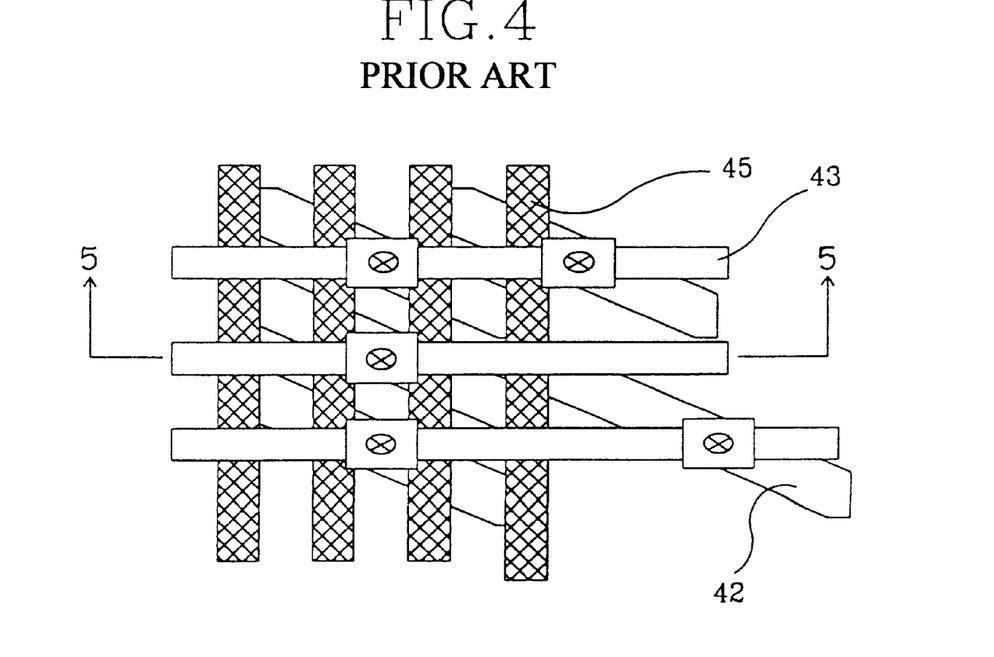
FIG. 4 is a plan view showing a lay out of a memory cell of a semiconductor memory device having an oblique active region according to the conventional art.

However, since the T-shaped active region 32 also has more corners than the rectangular active region 12 of FIG. 1A, serious shrinkage or distortion occurs in performing a photolithography process, thereby causing many problems in forming an active region. To solve the above problems, as shown in FIG. 4, a new cell array structure having an oblique active region 42 is suggested. In FIG. 4, reference numerals 43 and 45 represent a bit line and a gate line, respectively.

FIGS. 5A through 5E are longitudinal cross-sectional views, taken along the line 5—5 in FIG. 4, showing a fabrication method for a semiconductor memory device having the conventional COB structure.

Figure 5A:
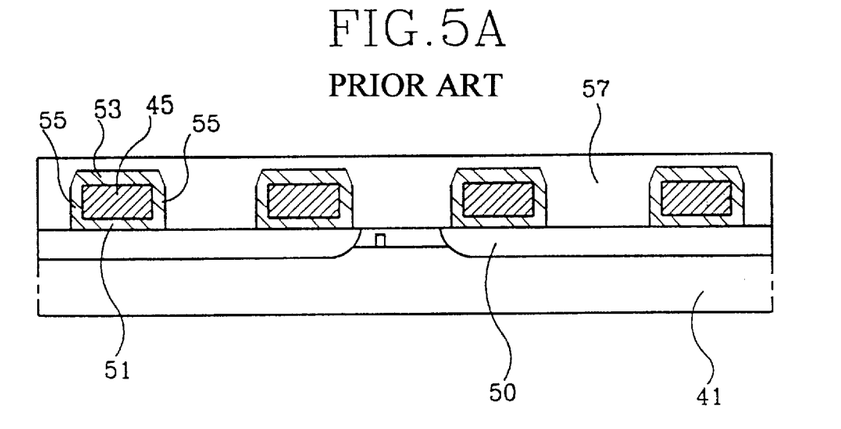
FIGS. 5A through 5E are sequential longitudinal cross-sectional views taken along the line 5—5 in FIG. 4 showing a fabrication method for a semiconductor memory device having the COB structure.

First, an oblique active region 42, as shown in FIG. 4, is formed on a semiconductor substrate 41 by a photo-etching method. Then, as shown in FIG. 5a, to electrically cut off single devices, a device isolation process is carried out, forming a field oxide region 50 and a silicon thermal oxide film which serves as a gate insulating film 51, using a thermal oxidation method on the semiconductor substrate 41. The silicon thermal oxide film is heated in an electric furnace at a $H_2/O_2$ atmosphere to obtain a thickness of about 80 Å which forms the gate insulating film 51. Then, on the gate insulating film 51, a polycrystalline silicon or an amorphous silicon film, which serves as a gate electrode 45, is formed to have a thickness of about 2000 Å by a low-pressure chemical vapor deposition ("LPCVD") method. Initially, the polycrystalline silicon or amorphous silicon film is undoped which becomes doped by ion implantation. The ion implantation can be performed while the polycrystalline film is being deposited. Then a silicon oxide film is deposited to have a thickness of about 1500 Å on the silicon film, which serves as the gate electrode 45, by the LPCVD method. Then, using the photo etching method, the silicon oxide film, the polysilicon film, and the silicon thermal oxide film are sequentially etched to form a polycrystalline gate pattern which includes the gate insulating film 51, the gate electrode 45, and the silicon oxide film 53, as shown in FIG. 5A. Next, on the entire surface of the above structure, an undoped oxide film is deposited and the oxide film is anisotropically etched using the reactive ion etching ("RIE") method to form a sidewall spacer 55 at a side wall of the gate electrode 45. Then, an oxide film which serves as an insulating film 57 is deposited to a thickness of about 5000 Å on the entire resultant surface. Here, a 03 tetra-ethylorthosilicate ("03 TEOS") or a boron phosphorus silicate glass ("BPSG") which can be easily planarized (i.e., flattened) is used as a material for the insulating film 57.

Figure 5B:
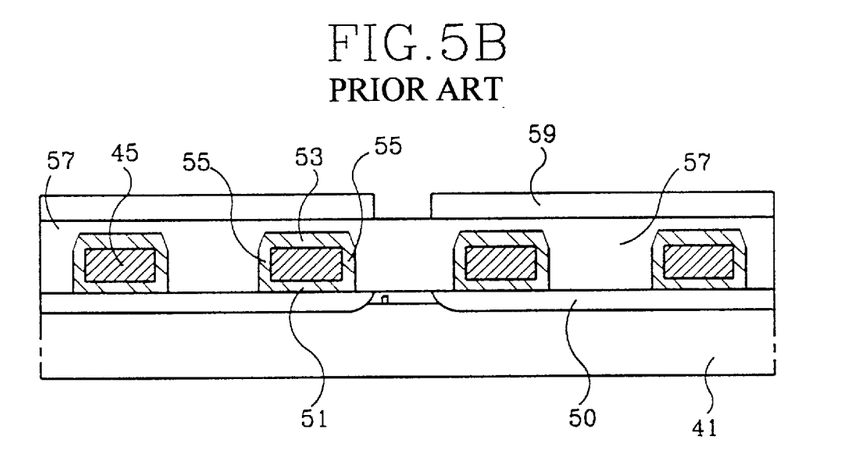

As shown in FIG. 5B, a photoresist film 59 is coated on the insulating film 57 to form a photoresist film pattern for forming a contact hole. The contact hole serves as a path for electrically connecting the active region 42 and a bit line 43 to be formed later.

Figure 5C:
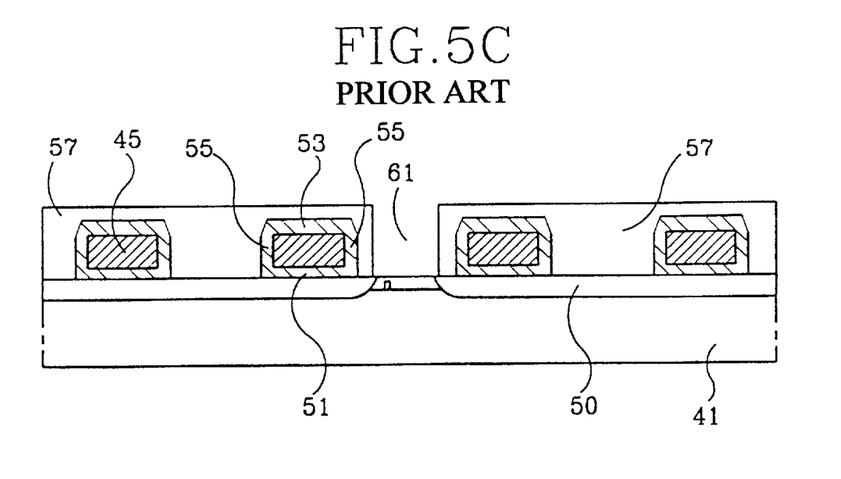

Then, as shown in FIG. 5C, an exposed portion of the insulating film 57 is etched to form the contact hole 61, using the patterned photoresist film 59 as a mask, until the surface of the active region 42 on the semiconductor substrate 41 is exposed. Then the photoresist film 59 is stripped off. Portions of the insulating film 57 protect the lateral spacer 55 and the insulating film 53 from being etched away when forming the contact hole 61. Here, the etching is carried out using the RIE method with a plasma of $CHF_3$ or $CF_4$ gas.

Figure 5D:
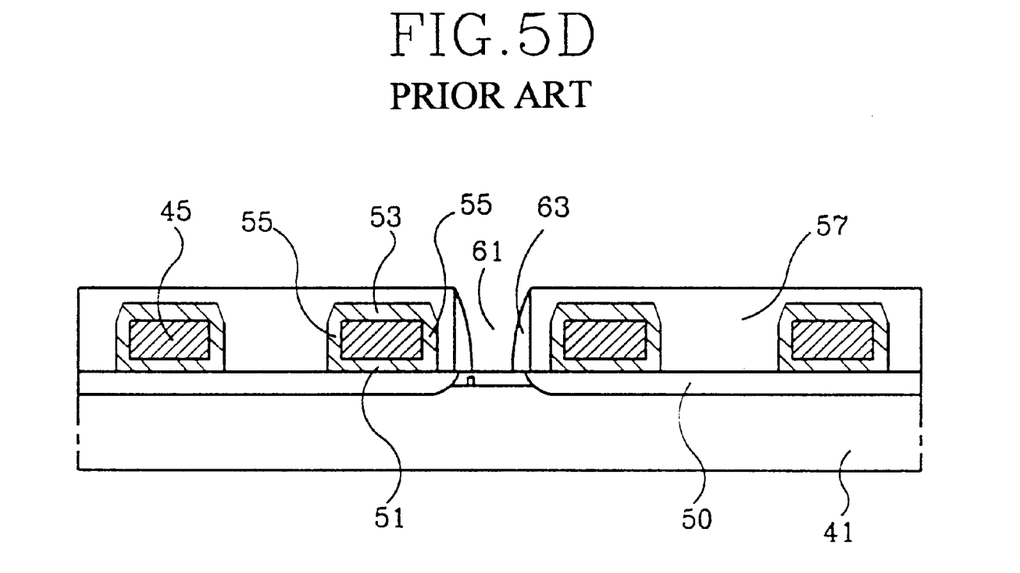
Figure 5E:
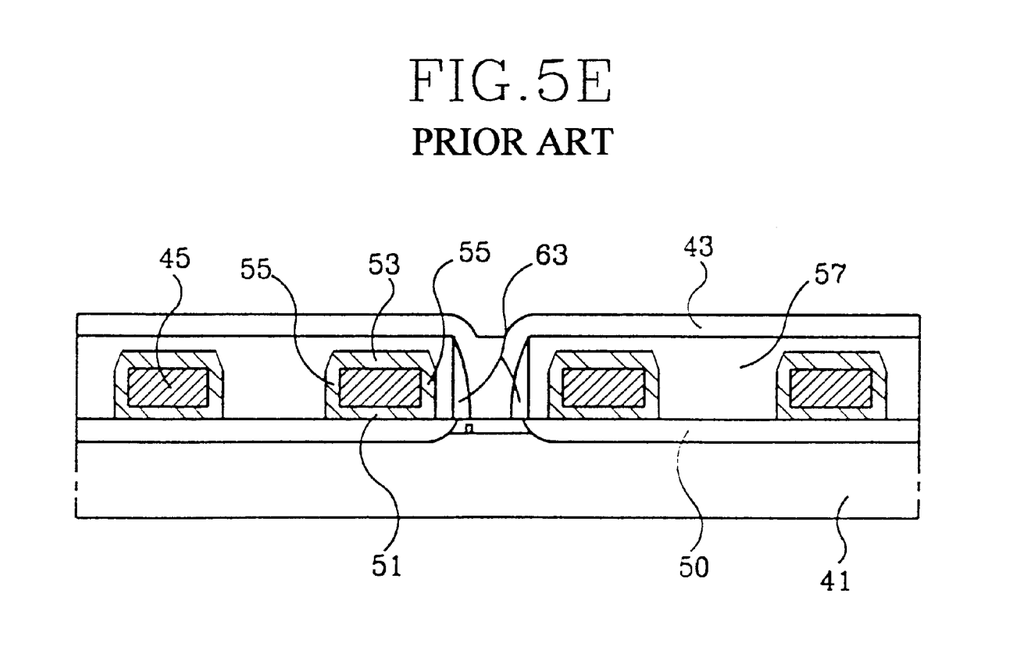

Next, as shown in FIG. 5D, sidewalls 63 are formed at lateral walls of the contact hole 61, and as shown in FIG. 5E, a polycrystalline film, which serves as the bit line 43, is deposited using the LPCVD method on the entire resultant surface to have a thickness of about 2000 Å. Then, a metal silicide is formed to have a thickness of about 1000 Å on the polysilicon film using the chemical vapor deposition ("CVD") method, and then the photoresist film (not illustrated) is coated on the metal silicide film, to form the photoresist film pattern for forming the bit line 43. Next, a bit line pattern is formed by sequentially etching the metal silicide film and the polysilicon film which are exposed using the RIE method with the patterned photoresist film acting as a mask. Then the photoresist film pattern is removed. A subsequent processes complete the formation of the semiconductor memory device by forming a capacitor (not illustrated) on the bit line 43. These subsequent processes are identical to the conventional fabrication method for a semiconductor memory device; therefore, the description thereof will be omitted.

However, in the semiconductor DRAM device having the above conventional oblique active region and the COB structure, the oblique active region can reduce serious shrinkage or distortion of the active region pattern, and the COB structure can reduce an aspect ratio of the contact hole for contacting the bit line. However, with high integration difficulty for fabricating semiconductor DRAM devices, development of a 1G type DRAM device is under progress. Accordingly, for a 1G type DRAM device, a design rule of below 0.2 μm is required. Consequently, it is difficult to design a cell block when the size of the contact hole becomes critical in size resulting in a difficult process. Because of increasingly high integration, complicated process steps are required that increase production costs. Therefore, process simplification is essentially required.

SUMMARY OF THE INVENTION

Accordingly, it is an object of the present invention to provide an improved fabrication method for a semiconductor memory device according to the present invention which is enhanced to be fit for at least a 256 DRAM or other semiconductor memory device requiring ultra high integration.

To achieve the above object, there is provided an improved fabrication method for a semiconductor memory device according to the present invention which includes forming an active region pattern on a semiconductor substrate, forming a field oxide region for electrically isolating single devices in the semiconductor substrate, forming a gate insulating film on the semiconductor substrate, forming a first conductive film to serve as a gate electrode on the gate insulating film, forming a first insulating film having a first etching characteristic on the first conductive film, patterning the first insulating film and the first conductive film to form a plurality of word line patterns, forming a second insulating film having the first etching characteristic on the entire resultant surface of the semiconductor substrate, etching the insulating film to form sidewall spacers at lateral walls of each word line pattern, forming a third insulating film on the entire resultant surface of the semiconductor substrate, removing the third insulating film from regions where a bit line is to be formed which exposes the active region and forms a bit line trench pattern, forming a bit line on the bit line trench pattern, and forming a capacitor over the bit line.

The fabrication method for a semiconductor memory device according to the present invention provides a larger area for a contact hole and provides a self alignment method in which an electrical contact between a bit line and an active region are automatically carried out by removing the third insulating film during the forming of a contact hole for contacting a bit line of a memory cell with an active region.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, wherein:

FIGS. 7A through 7D and 8A through 8D are sequential longitudinal cross-sectional views showing a fabrication method for a semiconductor memory device having the COB structure according to an embodiment of the present invention, wherein FIGS. 7A through 7D and 8A through 8D are cross-sectional views taken along the lines 7—7 and 8—8, respectively, in FIG. 6.

FIGS. 9A through 9E and 10A through 10E are sequential longitudinal cross-sectional showing a fabrication method for a semiconductor memory device having the COB structure according to another embodiment of the present invention, wherein FIGS. 9A through 9E and 10A through 10E are cross-sectional views taken along the lines 9—9 and 10—10, respectively, in FIG. 6.

DETAILED DESCRIPTION OF THE PREFERRED EMBODIMENTS

A semiconductor memory device, and its fabricating method according to the present invention will now be described with reference to the accompanying drawings.

Figure 6:
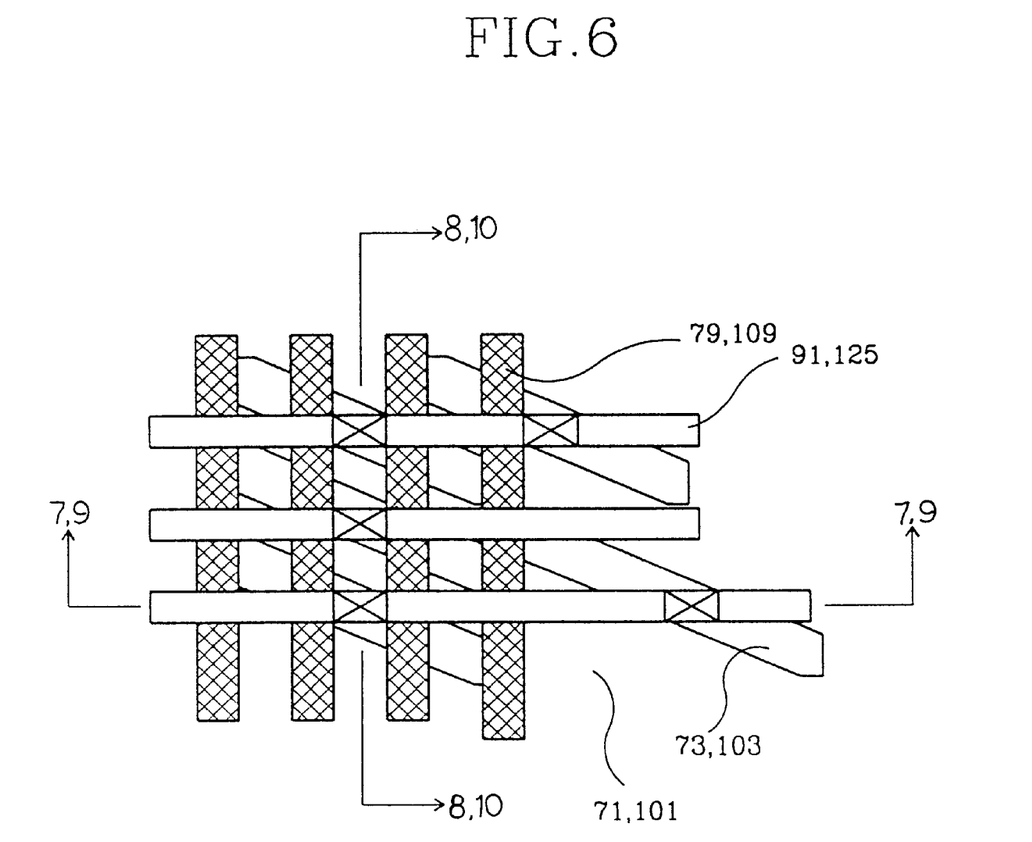
FIG. 6 is a plan view showing a lay out a memory cell of a semiconductor memory device having an oblique active region and the COB structure according to the present invention.

FIG. 6 is a plan view of a memory cell of a semiconductor memory device having an oblique active region 73 and a capacitor over bit line structure according to the present invention. However, the present invention is not limited to oblique active regions, but can also be used with other types of active regions, e.g., diagonal or T-shaped.

FIGS. 7A through 7D and FIGS. 8A through 8D are cross-sectional views taken along the lines 7—7 and 8—8 in FIG. 6, respectively.

Figure 7A:
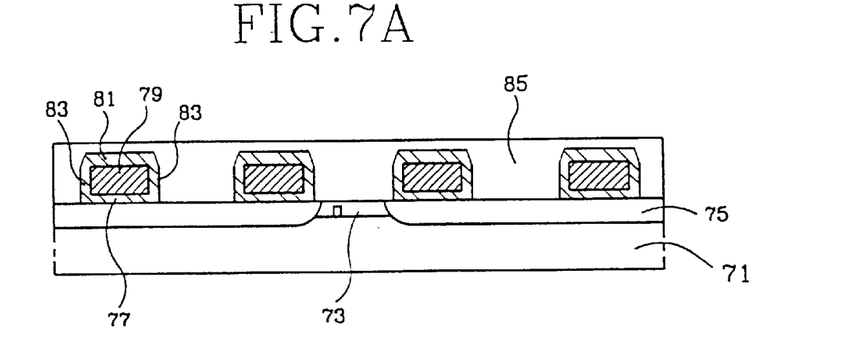
Figure 8A:
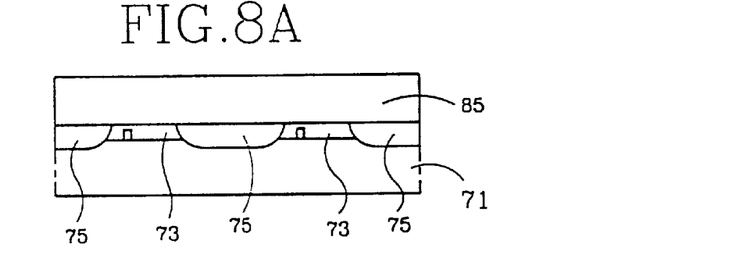

First, an oblique active region 73 pattern having the same shape as that in FIG. 6, is formed on a semiconductor substrate 71 using a photo-etching method. Then, as shown in FIGS. 7A and 8A, a field oxide region 75 is formed by performing a device isolation process for electrically cutting off single devices, and a gate insulating film 77 is formed of silicon thermal oxide film having a thickness of about 80 Å on the semiconductor substrate 71. The gate insulating film 77 is formed by heating the silicon thermal oxide film in an electric furnace at an $H_2/0_2$ atmosphere using a thermal oxidation method. Then, using the LPCVD method a gate electrode 79 is formed from a polycrystalline silicon or an amorphous silicon film having a thickness of about 2000 Å on the silicon thermal oxide film which serves as the gate insulating film 77. Initially, the polysilicon film is undoped, and becomes doped by ion implantation that can occur while the polycrystalline silicon is being deposited. Then, using the LPCVD method, a silicon nitride film, which serves as a first insulating film 81, is deposited to have a thickness of about 1500 Å on the gate electrode 79. Then, a word line pattern (that is, a gate line), comprising the gate electrode 79 and the first insulating film 81 formed on the gate insulating film 77, is formed by photo-etching the silicon nitride film which serves as the first insulating film 81 and the polysilicon film which serves as the gate electrode 79. Then, an undoped nitride film which serves as a second insulating film is deposited on the entire resultant surface, and the resultant nitride film is anisotropically etched using the RIE method to form sidewall spacers 83 at lateral walls of the patterned gate electrode 79, that is, at lateral walls of the word line. In this embodiment, the first insulating film 81 and the sidewall spacers 83 have the same etching characteristics.

Then, an oxide film, to serve as a third insulating film 85, is formed to have a thickness of about 5000 Å on the entire resultant surface. Here, the third insulating film 85 is composed of 03 TEOS or BPSG which tends to be easily planarized, and the planarization of the third insulating film 85 is carried out using a chemical mechanical polishing (CMP) method or a dry etching method.

Figure 7B:
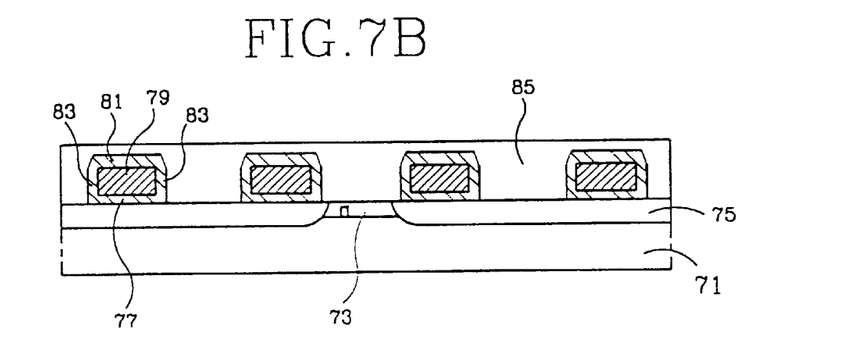
Figure 8B:
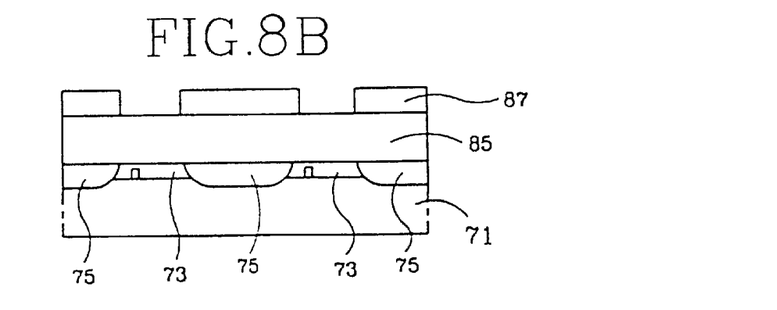

Then, as shown in FIGS. 7B and 8B, a photoresist pattern 87 is formed in such a manner that after the photoresist film is coated on the third insulating film 85, an upper surface of the third insulating film 85 is exposed on the region at which a bit line is to be formed. The bit line mask according to the present invention is transparently formed so that light permeates the bit line pattern on the mask, and the region except the bit line pattern is formed to be a blackout curtain. That is, when the photoresist film is coated on the third insulating film 85 and is exposed to light using the bit line mask, the photoresist film where the light permeated through the mask is removed to form the photoresist pattern 87. Thus a predetermined portion of the third insulating film 85 is exposed to serve as a bit line region, as shown in FIG. 8B.

Figure 7C:
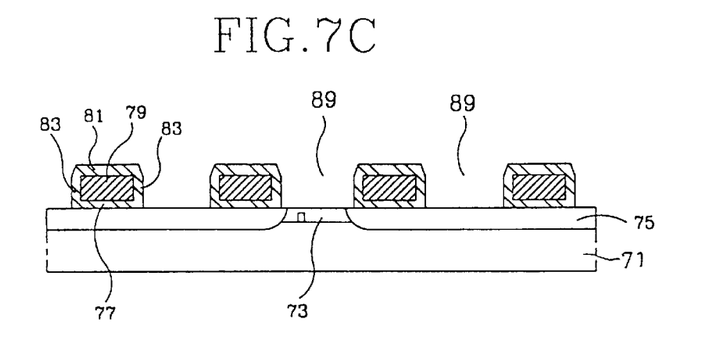
Figure 8C:
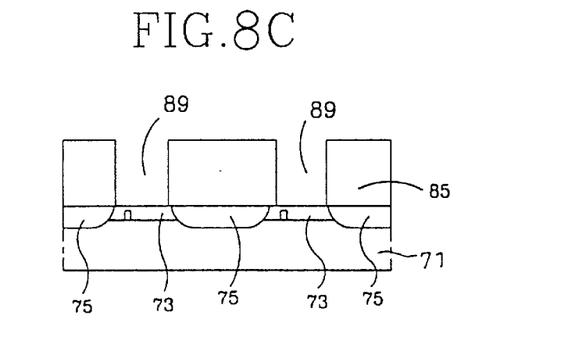

Next, as shown in FIGS. 7C and 8C, a bit line trench pattern 89 is formed by etching the exposed third insulating film 85 using a plasma of $CHF_3$ or $CF_4$ gas. Here, the etching of the third insulating film 85 is carried out until the active region 73 of the semiconductor substrate 71 is exposed. Then, the photoresist pattern 87 is removed. Because the etching characteristics of the first insulating film 81 and sidewall spacer 83 differ from the etching characteristic of the third insulating film, the etching process of third insulating film 85 does not cause the first insulating film 81 and sidewall spacer 83 to be etched away.

Figure 7D:
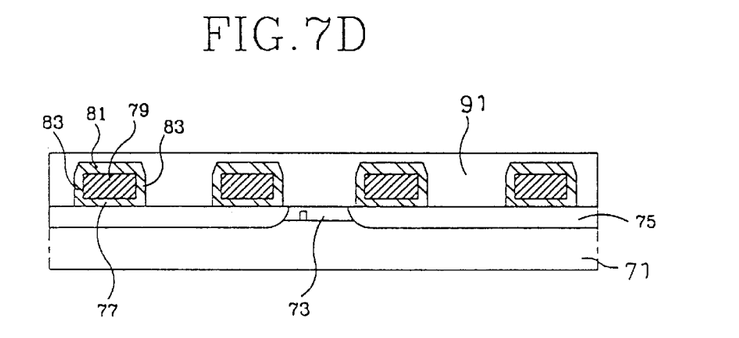
Figure 8D:
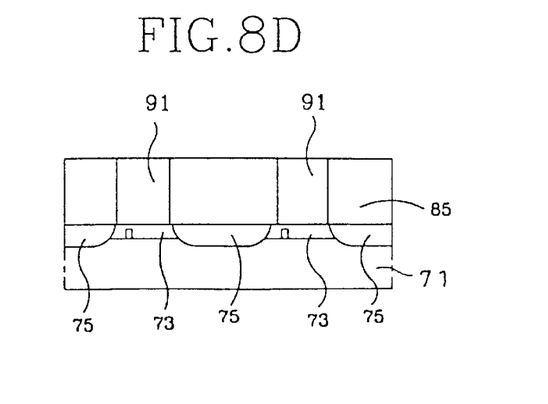

Then, as shown in FIGS. 7D and 8D, a conductive material is deposited to have a thickness of about 5000 Å using the LPCVD method on the entire resultant surface. The conductive material is planarized by polishing using the CMP method or by the dry etching method until the third insulating film 85 is exposed. Here, the conductive material is to serve as a bit line 91, and the conductive material is composed of a polycrystalline, amorphous silicon, or an arbitrary metal on which the CVD method and to which a material having a silicide film deposited on the polysilicon can be adopted.

The succeeding process steps of forming a capacitor after the bit line pattern is formed are a identical to a fabrication method for a semiconductor DRAM according to the conventional art such as disclosed in U.S. Pat. No. 5,140,389 hereby incorporated by reference.

As a result, the first embodiment of the present invention overcomes a deficiency of the conventional art. Specifically, the conventional art, as illustrated in FIGS. 5A–5C, had portions of a third insulating film 57 protecting the insulating layer 53 and lateral spacer 55 when etching the third insulating film 57 to form the bit line trench area 61. Because the etching characteristic of the third insulating film 57 is the same as the insulating layer 53 or lateral spacer 55, the third insulating film 57 could not be completely etched away. Accordingly, portions of insulating film 57 remain on and adjacent to the insulating layer 53 and lateral spacer 55.

In contrast, the present invention, as illustrated in FIGS. 7A–D and 8A–D, uses a first insulating film 81 and a second insulating film 83 having the same etching characteristic, and a third insulating film 85 having a different etching characteristic than the first insulating film 81 and second insulating film 83. For example, when the first and second insulating films 81 and 83 are formed of an oxide type film, the third insulating film 85 is formed of a silicon nitride film. Alternatively, when the first and second insulating films 81 and 83 are formed of a silicon nitride film, the third insulating film 85 is formed of an oxide type film. Because of the different etching characteristics between the third insulating film 85 and the first and second insulating films 81 and 83, the third insulating film 85 can be completely etched. As a result, a larger contact hole for a bit line can be formed.

FIGS. 9A through 9E and 10A through 10E are sequential longitudinal cross-sectional views taken along the lines 9—9 and 10—10, respectively, in FIG. 6.

Figure 9A:
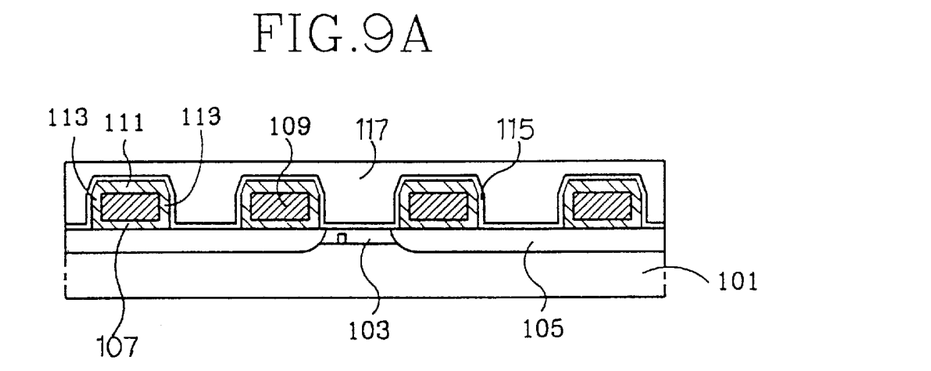
Figure 10A:
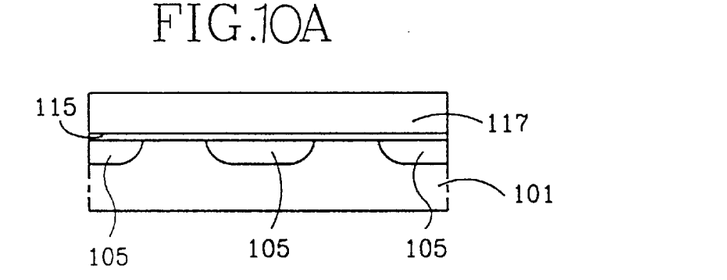

An oblique active region pattern, e.g., having the same shape as in FIG. 6, is formed on a semiconductor substrate 101 by using the photo-etching method. As shown in FIGS. 9A and 10A, a field oxide region 105 is formed, by carrying out a device isolation process, for electrically cutting off single devices, and a gate insulating film 107 is formed, from a silicon thermal oxide film, to have a thickness of about 80 Å on the semiconductor substrate 101. The gate insulating film 107 is formed by heating the silicon in an electric furnace at an $H_2/O_2$ atmosphere using the thermal oxidation method. Then, using the LPCVD method, a film is deposited which serves as a gate electrode 109 to have a thickness of about 2000 Å on the gate insulating film 107. Initially, the polycrystalline silicon or an amorphous silicon film is undoped which becomes doped by ion implantation. The ion implantation can be performed while the polycrystalline silicon is being deposited. Then, using the LPCVD method, a silicon nitride film is deposited to serve as a first insulating film 111 having a thickness of about 1500 Å on the film which serves as the gate electrode 109. Then, a word line pattern (that is, a gate line) is formed in a stacked order of the gate electrode 109 and the first insulating film 111 on the gate insulating film 107. The gate line is formed by etching the silicon nitride to serve as the first insulating film 111 and the polycrystalline silicon or an amorphous silicon film to serve as the gate electrode 109. Then, an undoped oxide film is deposited on the entire resultant surface to serve as a second insulating film 113, and the resultant oxide film is anisotropically etched using the RIE method to form sidewall spacers 113 composed of the oxide film at lateral walls of the patterned gate electrode 109 or at lateral walls of the word line.

Then, a silicon nitride film to serve as a third insulating film 115 is formed to a thickness of about 500 Å on the entire resultant surface. A chemical deposition oxide film, to serve as a fourth insulating film 117, is deposited to a thickness of about 5000 Å. Here, the fourth insulating film 117 is composed of 03TEOS or BPSG which tends to be easily planarized. The planarization of the fourth insulating film 117 is carried out using a CMP method or using a dry etching method.

Figure 9B:
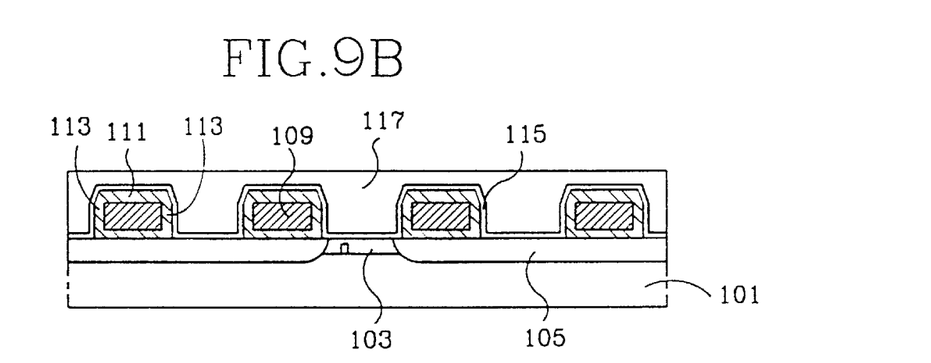
Figure 10B:
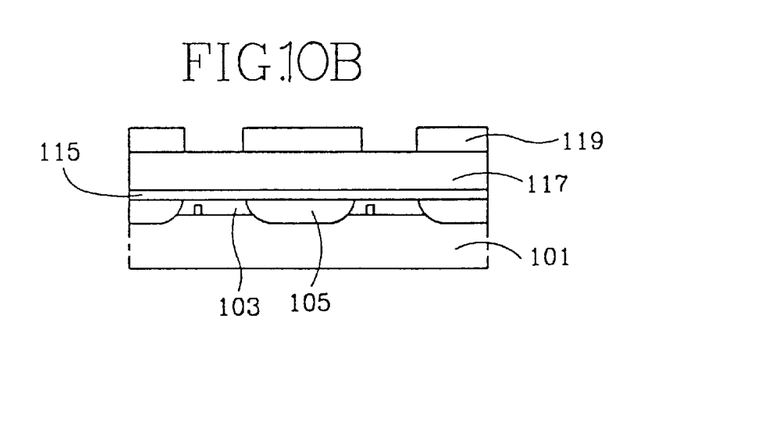

Then, as shown in FIGS. 9B and 10B, a photoresist pattern 119 is formed on the fourth insulating film 117. The photoresist pattern 119 is formed on the fourth insulating film 117 to expose a region in which a bit line is to be formed using a bit line mask (not illustrated) according to the present invention. The bit line mask, according to the present invention is transparently formed to permeate light of the bit line pattern on the mask, and the region except the bit line pattern is formed as a blackout curtain. That is, when the photoresist film is coated on the fourth insulating film 117 and is exposed to light using the bit line mask, the photoresist film is removed to form the photoresist pattern 117. The photoresist pattern 117 is used to expose a portion of the fourth insulating film 117 to serve as a bit line region, as shown in FIG. 9B.

Figure 9C:
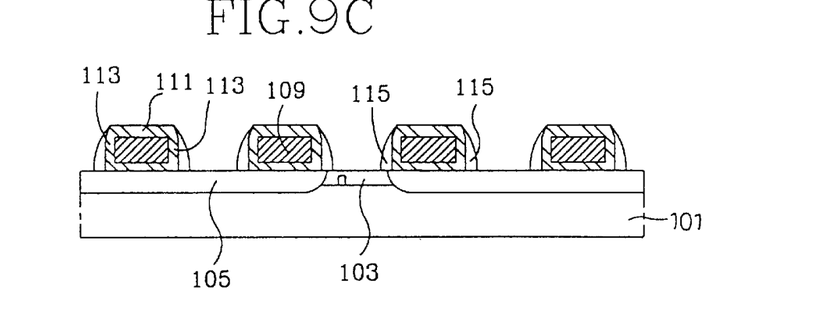
Figure 10C:
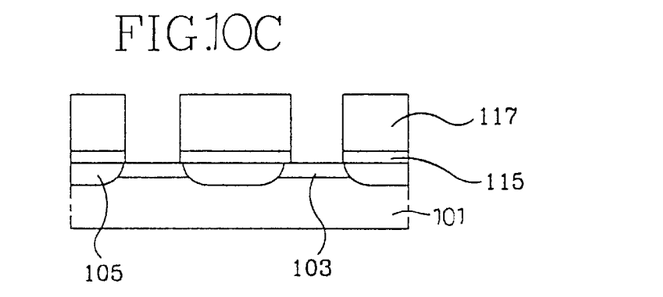

Next, as shown in FIGS. 9C and 10C, the exposed fourth insulating film 117 is etched with a plasma of $CHF_3$ or $CF_4$ gas using the RIE method. Then the third insulating film 115 is exposed, and is etched to form a bit line trench pattern 121. Here, the fourth and third insulating films 117,115 are etched until the third insulating film 115 remains on the surface portion of the sidewall spacer 113 and the active region 103 is exposed. Then, the photoresist pattern 119 is removed.

Figure 9D:
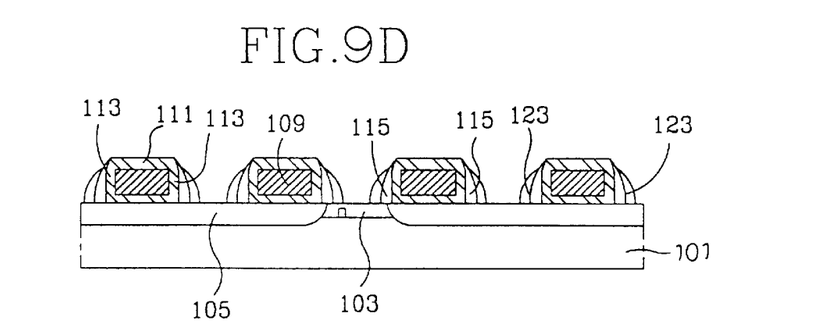
Figure 10D:
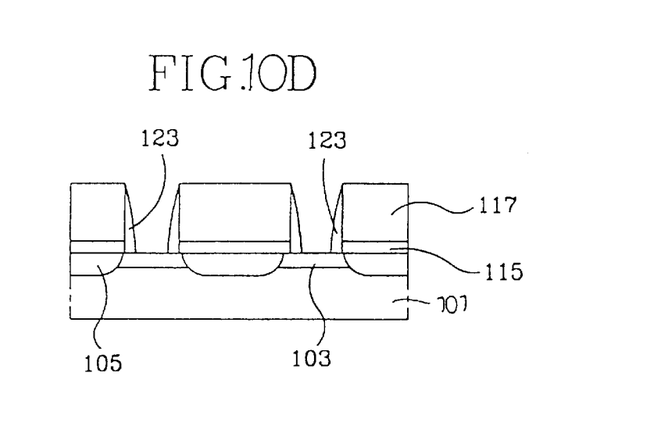

As shown in FIGS. 9D and 10D, a silicon nitride film is deposited to serve as a fifth insulating film 123 to a thickness of about 500 Å on the entire resultant surface, and sidewalls 123 to serve as the fifth insulating film 123 are formed at an inner side wall of the bit line trench pattern 121 by anisotropically etching the resultant surface using a dry etching method until the active region 103 is exposed. The sidewall 123 is formed to achieve a more accurate alignment of the bit line.

Figure 9E:
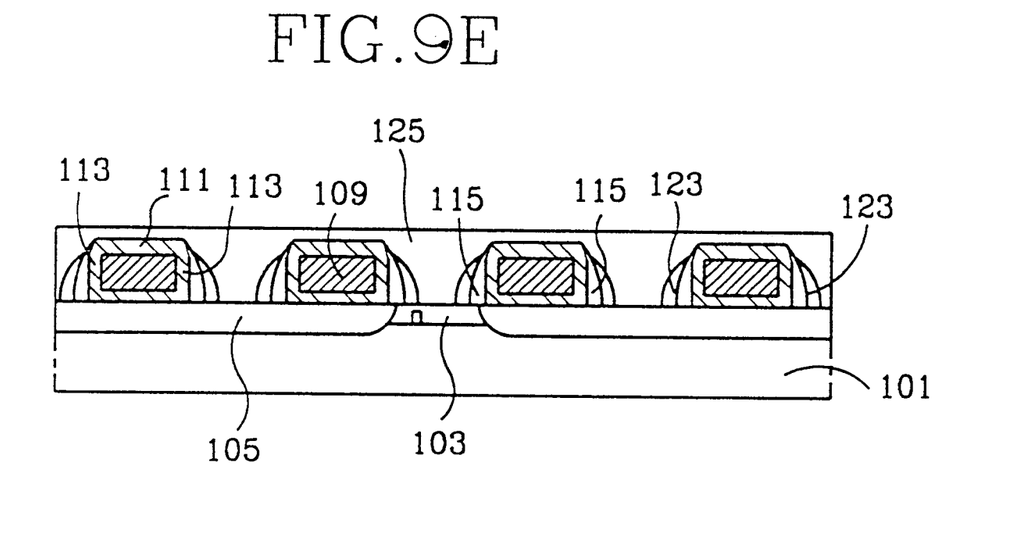
Figure 10E:
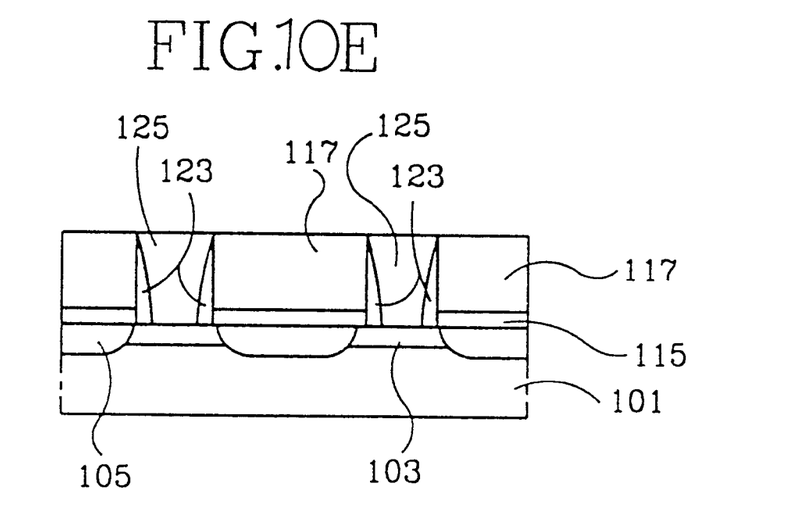

Then, as shown in FIGS. 9E and 10E, a conductive material is deposited to a thickness of 5000 Å on the entire resultant surface using LPCVD method, and then in using the CMP method, the conductive material is polished and planarized until the fourth insulating film 117 is exposed. Here, the conductive material finally serves as a bit line 125, and the material is composed of a polycrystalline or amorphous silicon, or an arbitrary metal on which the CVD is available, or material having a silicide film formed on the polycrystalline silicon can be also used.

As described above, the succeeding process of forming a capacitor after the bit line pattern is formed is identical to a fabrication method for a semiconductor DRAM according to the conventional art such as disclosed in U.S. Pat. No. 5,140,389 hereby incorporated by reference.

As a result, in the embodiment described above, the etching characteristics of the third insulating film 115 is different from that of the fourth insulating film 117. When the bit line trench pattern 121 is formed by etching the fourth insulating film 117, the third insulating film 115 serves as an etch stop film, which prevents the gate electrode 109 from being exposed and etched away. For example, in case the third insulating film 115 is formed of a silicon nitride film, the fourth insulating film 117 is formed of a silicon oxide film, but in the case when the third insulating film 115 is formed of a silicon oxide film, the fourth insulating film 117 is formed of a silicon nitride film.

As described in detail above, according to the fabrication method for a semiconductor memory device according to the present invention, when the semiconductor memory device is fabricated, the bit line contact is proceeded in a self-alignment method instead of a bit line contact having the least design margin, resulting in a simplified process. Further, since a bit line is buried in an insulating film, the planarization process is simpler. As a result, the aspect ratio of a contact hole for the node contact is reduced when forming a capacitor, and etching damage on the semiconductor substrate to form the contact hole is minimized. Also, a topology between a memory cell area and the peripheral area due to the bit line formed by the burying method is much improved, resulting in making a wiring process performed after the cell process easier. Since the bit line is contacted in an active region by a self-alignment method, the mask process for forming a contact hole is omitted, resulting in simplified process and reduced production cost. In an electrical aspect of the device, a longitudinal cross-sectional area of the bit line according to the present invention can be made larger and the bit line contact region can be maximized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a semiconductor memory device, comprising the steps of:

forming an active region pattern on a semiconductor substrate;

forming a field oxide region for electrically isolating single devices in the semiconductor substrate;

forming a gate insulating film on the semiconductor substrate;

forming a first conductive film to serve as a gate electrode on the gate insulating film;

forming a first insulating film having a first etching characteristic on the first conductive film;

patterning the first insulating film and the first conductive film to form a plurality of word line patterns;

forming a second insulating film having the first etching characteristic over the semiconductor substrate;

etching the second insulating film to form sidewall spacers at lateral walls of each word line pattern;

forming a third insulating film over the semiconductor substrate, the third insulating film having a second etching characteristic which is different from said first etching characteristic;

removing the third insulating film to expose the active region and form a bit line trench pattern;

forming a bit line, a portion of the bit line being disposed in the bit line trench pattern; and forming a capacitor over the bit line.

2. The method of claim 1, wherein the forming the bit line step includes the substeps of:

forming a second conductive film over the semiconductor substrate; and patterning the second conductive film to form the bit line.

3. The method of claim 1, wherein the bit line crosses the active region, and the active region has one of an oblique, diagonal, and T shape.

4. The method of claim 1, wherein the first and second insulating films are oxide films and the third insulating film is a silicon nitride film.

5. The method of claim 1, wherein the first and second insulating films are silicon nitride films and the third insulating film is an oxide film.

6. The method of claim 5, wherein the third insulating film is one of a O3 tetra-ethyl-orthosilicate (TEOS) and a boron phosphorus silicate glass (BPSG).

7. The method of claim 1, further comprising, prior to the step of removing the third insulating film, the step of:

planarizing the third insulating film.

8. A method for fabricating a semiconductor memory device, comprising the steps of:

forming an active region pattern on a semiconductor substrate;

forming a field region for electrically isolating single devices in the semiconductor substrate;

forming a gate insulating film on the semiconductor substrate;

forming a first conductive film to serve as a gate electrode on the gate insulating film;

forming a first insulating film on the first conductive film;

patterning the first insulating film and the first conductive film so as to form a word line pattern;

forming a second insulating film over the semiconductor substrate;

etching the second insulating film so as to form first sidewall spacers at lateral walls of the word line pattern;

forming a third insulating film over the semiconductor substrate, the third insulating film having a first etching characteristic;

forming a fourth insulating film on the third insulating film, the fourth insulating film having a second etching characteristic different from said first etching characteristic;

removing the third and fourth insulating films to configure a bit line trench pattern which exposes the active region;

forming a fifth insulating film over the semiconductor substrate;

removing the fifth insulating film until the active region is exposed so as to form second sidewalls at inner lateral walls of the bit line trench pattern;

forming a bit line, a portion of the bit line being disposed in the bit line trench pattern; and forming a capacitor over the bit line.

9. The method of claim 8, wherein the forming the bit line step includes the substeps of:

forming a second conductive film over the semiconductor substrate;

patterning the second conductive film to form the bit line.

10. The method of claim 8, wherein the bit line crosses the active region, and the active region has one of an oblique, diagonal, and T shape.

11. The method of claim 8, wherein the third insulating film is an oxide film and the fourth insulating film is a silicon nitride film.

12. The method of claim 8, wherein the third insulating film is a silicon nitride film and the fourth insulating film is an oxide film.

13. The method of claim 12, wherein the fourth insulating film material is one of a O3 tetra-ethyl-orthosilicate (TEOS) and a boron phosphorus silicate glass (BPSG).

14. The method of claim 8, further comprising, prior to the step of etching the third and fourth insulating films, the step of:

planarizing the fourth insulating film.

15. The method of claim 8, wherein the fifth insulating film is one of an oxide and silicon nitride film.

16. The method of claim 9, wherein the first insulating film has the second etching characteristic, and the second insulating film has the first etching characteristic.

* * * * *